United States Patent
Shao

(10) Patent No.: US 9,288,934 B2
(45) Date of Patent: Mar. 15, 2016

(54) ELECTRONIC DEVICE HAVING CLIP CLASPING ELECTRONIC MODULE

(71) Applicant: HON HAI PRECISION INDUSTRY CO., LTD., New Taipei (TW)

(72) Inventor: Chun-Hao Shao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 322 days.

(21) Appl. No.: 14/054,769

(22) Filed: Oct. 15, 2013

(65) Prior Publication Data

US 2015/0085450 A1 Mar. 26, 2015

(30) Foreign Application Priority Data

Sep. 23, 2013 (TW) .............................. 102134180 A

(51) Int. Cl.
*H05K 7/12* (2006.01)
*H05K 7/20* (2006.01)

(52) U.S. Cl.
CPC ........ *H05K 7/20727* (2013.01); *H05K 7/20172* (2013.01)

(58) Field of Classification Search
CPC .......................... H05K 7/20727; H01L 23/4006

USPC .......................... 361/747, 756, 726, 802, 740
See application file for complete search history.

(56) References Cited

U.S. PATENT DOCUMENTS 6,549,424 B1 * 4/2003 Beseth ................ H05K 7/1409
361/726
6,618,259 B1 * 9/2003 Hood, III ........... G06K 13/0825
361/726

FOREIGN PATENT DOCUMENTS

CN         202759698 U    2/2013
TW         568298 U       12/2003
TW         M338537 U      8/2008

* cited by examiner

*Primary Examiner* — Dion R Ferguson
*Assistant Examiner* — Mandeep S Buttar
(74) *Attorney, Agent, or Firm* — Novak Druce Connolly Bove + Quigg LLP

(57) ABSTRACT

An electronic device includes a frame, a electronic module, and a clip. The frame includes a supporting plate and a first bracket mounted on the supporting plate. The electronic module is located at the supporting plate. A guiding groove is defined in the electronic module. The clip is mounted on the frame and connects the electronic module. The clip includes a mounting portion mounted on the first bracket and a clasp extending from the mounting portion. The clasp can slide along the guiding groove to elastically clasp the first bracket.

17 Claims, 3 Drawing Sheets

ELECTRONIC DEVICE HAVING CLIP CLASPING ELECTRONIC MODULE

BACKGROUND

1. Technical Field

The present disclosure relates to an electronic device having an electronic module and a clip clasping the electronic module.

2. Description of Related Art

A conventional electronic device, such as a server, includes a frame and a plurality of electronic modules mounted on the frame. Each electronic module includes a bracket and electronic components received in the bracket. A plurality of screws extends through the bracket of the electrode module and engages with the frame to assemble the electronic module on the frame. However, this is time-consuming to use a technical tool to assemble to or disassemble the screws from the frame one by one by.

What is needed, therefore, is an improved electronic device which overcomes the above described shortcomings.

DETAILED DESCRIPTION

An embodiment of an electronic device in accordance with the present disclosure will now be described in detail below and with reference to the drawings.

Figure 1:
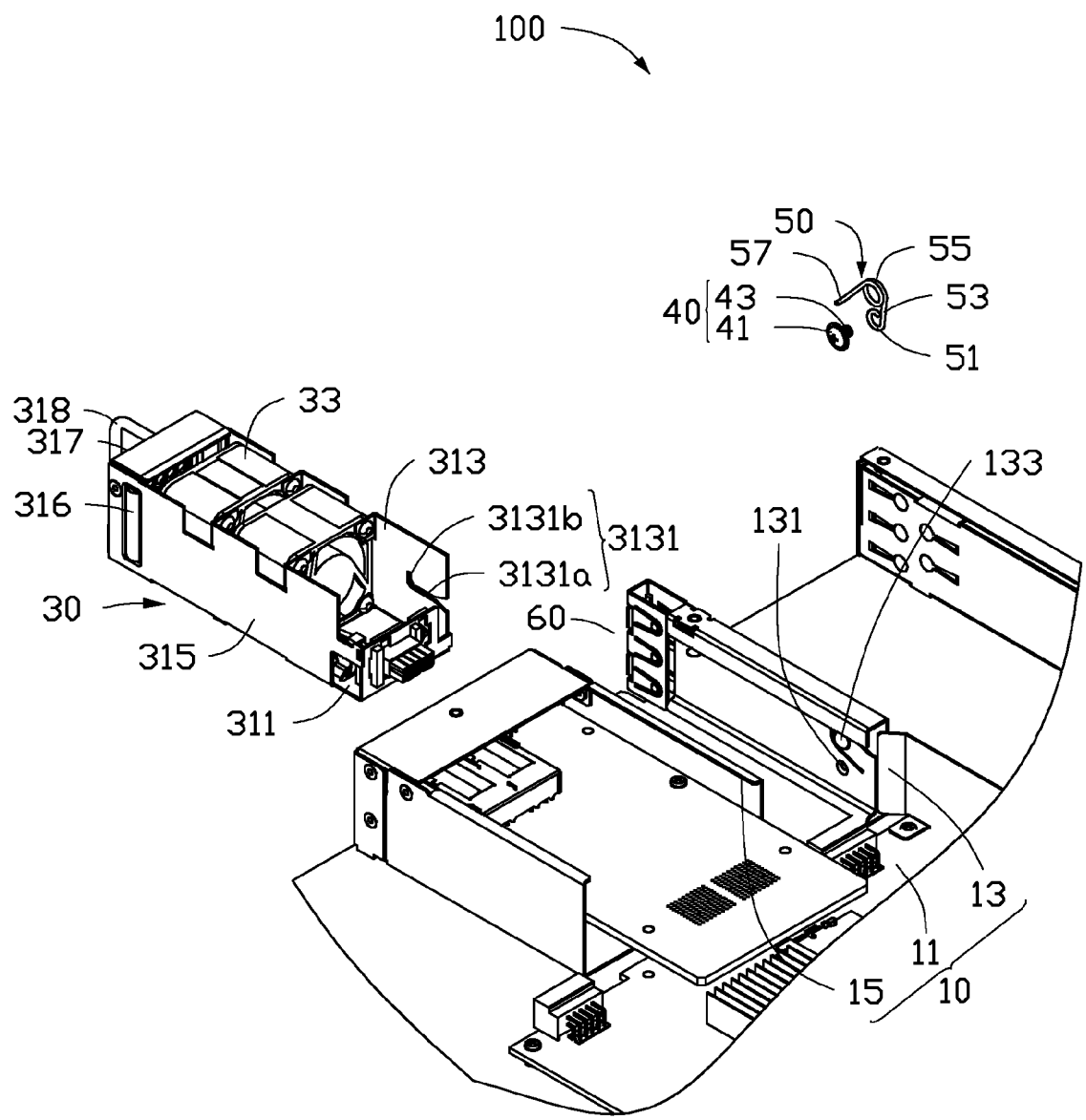
FIG. 1 is an exploded view of an electronic device of an exemplary embodiment of the present disclosure.

In the description that follows, the stated orientations of all of the elements of the electronic device are with reference to the orientations of all of the elements as shown in FIG. 1.

Figure 2:
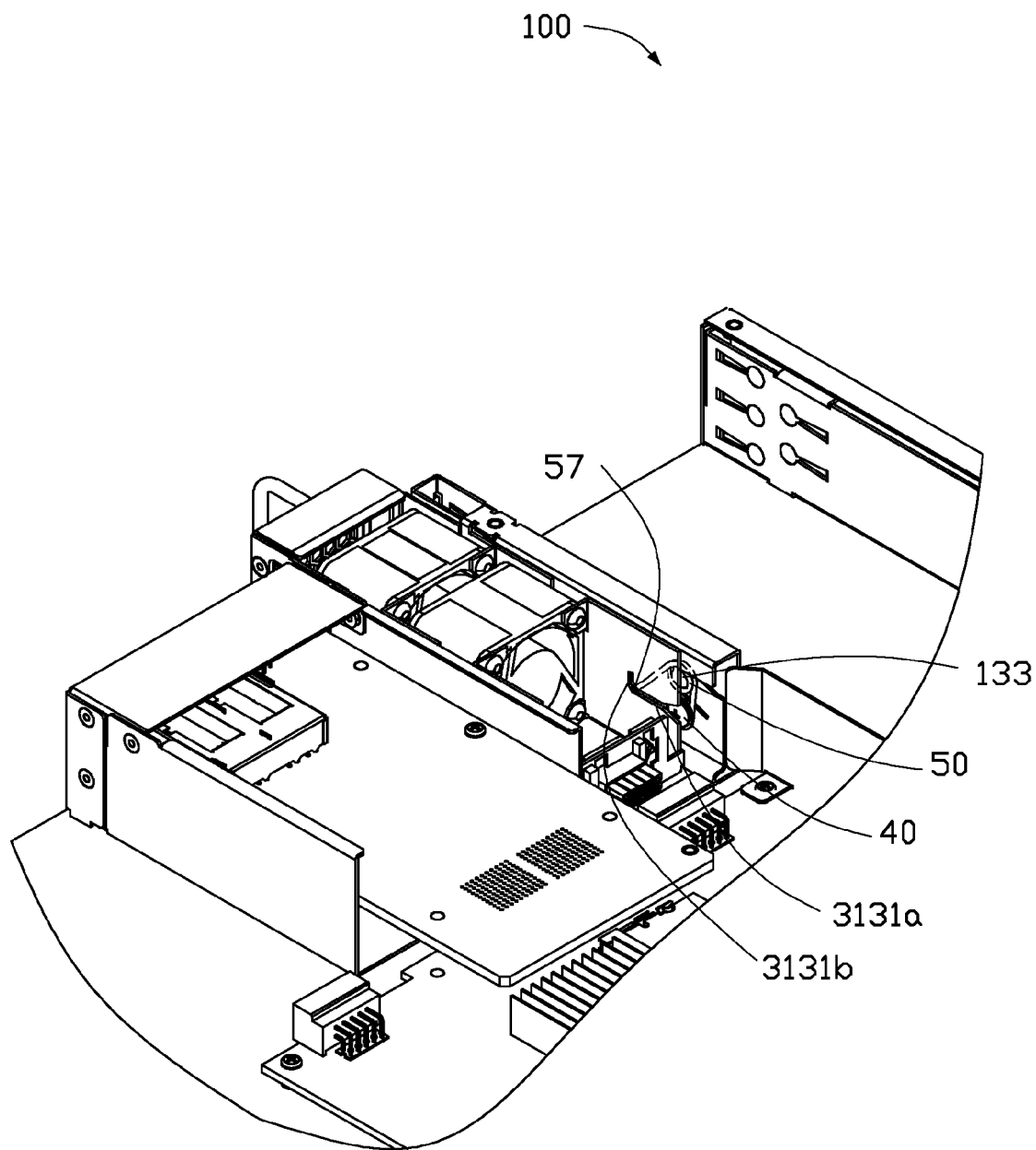
FIG. 2 is an assembled view of the electronic device of FIG. 1, wherein an electronic module of the electronic device is unlocked.

Referring to FIGS. 1 to 2, an electronic device 100 in accordance with an exemplary embodiment includes a frame 10, an electronic module 30 mounted on the frame 10, and a clip 50 assembled on the frame 10 and connecting the electronic module 30.

The frame 10 includes a supporting plate 11, a first bracket 13 and a second bracket 15 mounted on the supporting plate 11. The supporting plate 11 is an elongated plate. The first bracket 13 is an elongated plate. A bottom side of the first bracket 13 is mounted on a top surface of the supporting plate 11. The first bracket 13 is perpendicular to the supporting plate 11. A mounting hole 131 is defined in a rear end of the first bracket 13 to receive a fastener 40 therein. The fastener 40 is used to fasten the clip 50 on the first bracket 13. A positioning member 133 is formed on the rear end of the first bracket 13 to position the clip 50. The positioning member 133 is aligned with the mounting hole 131 and located at a top of the mounting hole 131. In this embodiment, the positioning member 133 is a protrusion protruding from the first bracket 13.

In this embodiment, the fastener 40 is a screw and includes a head 41 and a pole 43 extending from a central portion of the head 41. The head 41 and the pole 43 are cylindrical. A diameter of the head 41 is larger than that of the pole 43 and is larger than a bore diameter of the mounting hole 131. The pole 43 is used to extend through the clip 50, the mounting hole 131 and screw with the first bracket 13 to fasten the clip 50 on the first bracket 13.

The second bracket 15 faces and aligned with the first bracket 13. The second bracket 15 is spaced from the first bracket 13. The first bracket 13, the second bracket 15 and the supporting plate 11 cooperatively define a receiving chamber 60 therebetween to receive the electronic module 30 therein. In this embodiment, the second bracket 15 is an elongated plate and a bottom side of the second bracket 15 is mounted on the top surface of the supporting plate 11. The second bracket 15 is perpendicular to the supporting plate 11 and parallel to the first bracket 13. A length of the first bracket 13 is equal to that of the second bracket 15. Opposite ends of the first bracket 13 are respectively aligned with opposite ends of the second bracket 15. A depth of the receiving chamber 60 is larger than a height of the electronic module 30.

The electronic module 30 includes a housing 31 and a fan module 33 received in the housing 31. Alternatively, other electronic components may be received in the housing 31. The housing 31 includes an elongated bottom plate 311, a first sidewall 313 and a second sidewall 315 perpendicularly extending from opposite sides of the bottom plate 311, and a connecting plate 317 perpendicularly extending from a front end of the bottom plate 311. Each first sidewall 313, second sidewall 315, and the connecting plate 317 is rectangular. Opposite sides of the connecting plate 317 interconnect front ends of the first sidewall 313 and the second sidewall 315. A handle 318 is formed on an outer side of the connecting plate 317 for operating the electronic module 30 expediently. In this embodiment, the handle 318 is a U-shaped strip.

The first sidewall 313 and the second sidewall 315 are elongated and parallel to each other. A rear end of the first sidewall 313 is away from the connecting plate 317 and a guiding groove 3131 is defined therein to receive the clip 50. The guiding groove 3131 is L-shaped and includes a first guiding section 3131a and a second guiding section 3131b extending from the first guiding section 3131a. The first guiding section 3131a is horizontal and extends from a rear edge along a longitudinal direction of the first sidewall 313. The second guiding section 3131b is vertical and extends upwardly from a front end of the first section 3131a. The first guiding section 3131a and the second guiding section 3131b communicate with each other. A width of a rear end of the first section 3131a is larger than that of the other portion of the first section 3131a to guide the clip 50 to enter the guiding groove 3131. A length of the second guiding section 3131b is less than that of the first guiding section 3131a.

A width of the electronic module 30 is slightly less than or equal to that of the receiving chamber 60. Two elastic pressing portions 316 protrude outwardly from front ends of the first sidewall 313 and the second sidewall 315 to abut the first bracket 13 and the second bracket 15. The two pressing portions 316 face each other. The fan module 33 is sandwiched between the first sidewall 313 and the second sidewall 315 and a top end of the fan module 33 is below top sides of the first sidewall 313 and the second sidewall 315.

The clip 50 is a wire clip and includes a connecting arm 53, a mounting portion 51 and a positioning portion 55 formed on opposite ends of the connecting arm 53, and a clasp 57 extending from the positioning portion 55. The fastener 40 extends through the mounting portion 51, the mounting hole 131 and screws with the first bracket 13 to fasten the clip 50 on the first bracket 13. The connecting arm 53 is annular and is rotatable relative to the pole 43 of the fastener 40. The positioning portion 55 hooks the positioning member 133 of the first bracket 13 to position the clip 50. The positioning portion 55 is annular. The clasp 57 is L-shaped and used to slide along the guiding groove 3131 to clasp the first sidewall 313. The clasp 57 and the connecting arm 53 are located at opposite sides of the positioning portion 55 and cooperatively form a V-shaped configuration.

Figure 3:
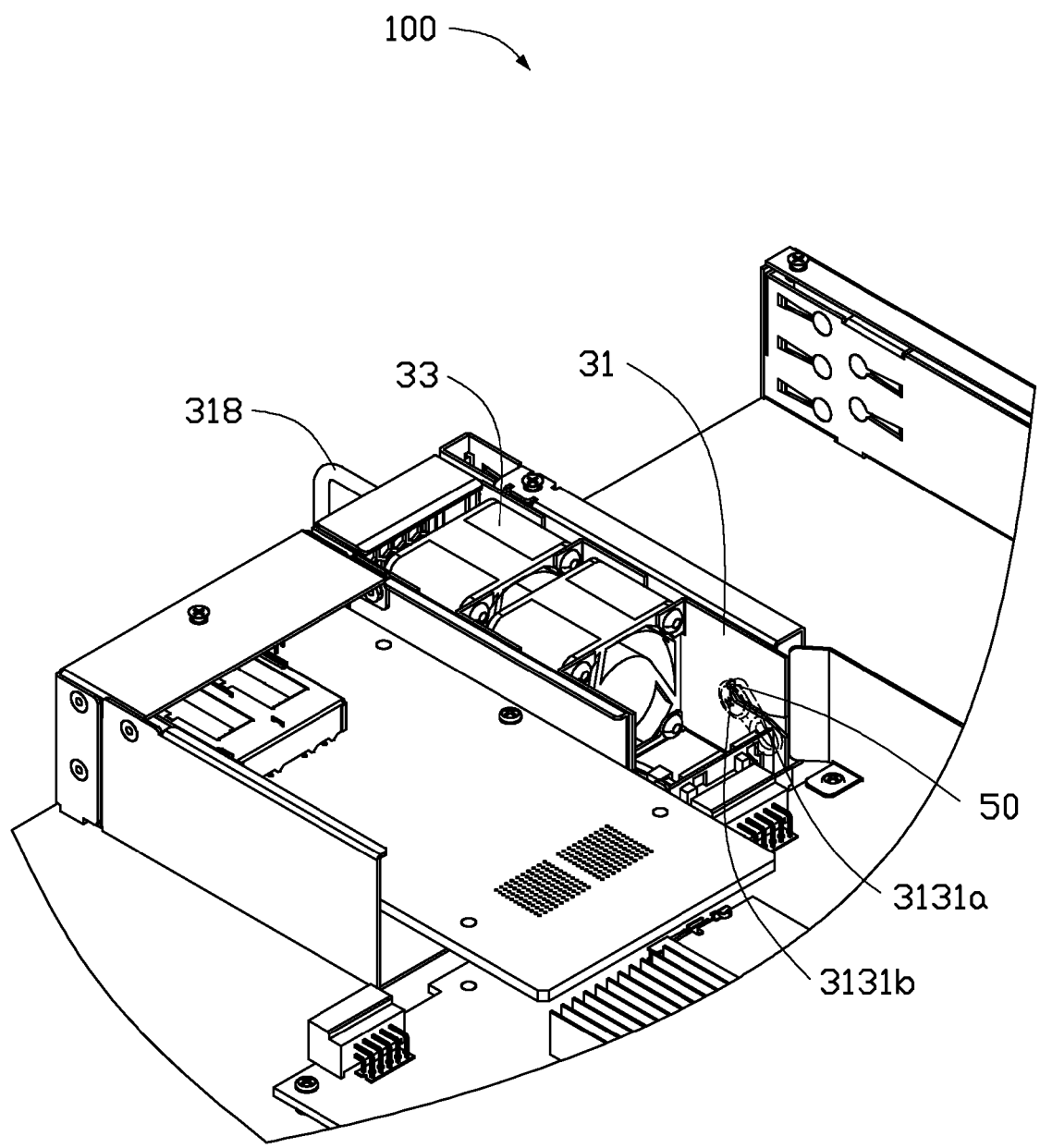
FIG. 3 is an assembled view of the electronic device of FIG. 1, wherein the electronic module of the electronic device is locked.

Referring to FIGS. 2 to 3, when the electronic module 30 is assembled from the frame 10, the clip 50 is positioned on the first bracket 13, and a rear end of the electronic module 30 is pushed into the receiving chamber 60 by operating the handle 318 from a front end of the receiving chamber 60 away from the positioning member 133. The electronic module 30 is pushed continuously to make the clasp 57 of the clip 50 enter into the guiding groove 3131 and slide along the first section 3131a. The first sidewall 313 pushes the positioning portion 55 of the clip 50 to make the positioning portion 55 be disassembled from the positioning member 133 when the first sidewall 313 sliding. The electronic module 30 is pushed again to make the clasp 57 be pressed and slide from the first section 3131a to the second section 3131b. In this process, the clip 50 rotates relative to the pole 43 and is compressed. When the clasp 57 enters the second section 3131b, the clasp 57 is released, arrived to a top end of the second section 3131b and elastically abuts the first sidewall 313. In this state, the electronic module 30 is locked.

When the electronic module 30 is disassembled from the frame 10, the clasp 57 is pressed downwardly, and the electronic module 30 is pulled outwardly along the receiving chamber 60 until the electronic module 30 is completely pulled out from the receiving chamber 60. In this process, the clasp 57 slides from the second section 3131b to the first section 3131a, the connecting portion 51 rotates about the pole 43, the clip 50 is released and elastically hooks the positioning member 133.

In this disclosure, the electronic module 30 is pushed or pulled along the receiving chamber 60 to make the electronic module 30 locked by the clip 50 or disassembled from the frame 10. Thus, the assembly or disassembly processes of the electronic device 100 are time-saving and the technical tool is omitted.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising: a frame comprising a supporting plate and a first bracket mounted on the supporting plate; an electronic module located at the supporting plate, and a guiding groove defined in the electronic module; and a clip mounted on the frame and connecting the electronic module, the clip comprising a mounting portion mounted on the first bracket and a clasp extending from the mounting portion wherein the clasp can slide along the guiding groove to elastically clasp the first bracket and wherein the clip further comprises a positioning portion, and a connecting arm, the first bracket comprises a positioning member, and the positioning portion elastically hooks the positioning member, the positioning portion and the mounting portion are respectively located at opposite ends of the connecting arm.

2. The electronic device of claim 1, wherein the positioning member is a protrusion protruding from the first bracket.

3. The electronic device of claim 2, wherein the positioning portion is annular.

4. The electronic device of claim 1, wherein the clasp extends from the positioning portion, the clasp and the connecting arm are located at opposite sides of the positioning portion and cooperatively form a V-shaped configuration.

5. The electronic device of claim 1, wherein a mounting hole is defined in the first bracket, a fastener extends through the mounting portion of the clip, the mounting hole of the first bracket, and engages with the first bracket to assemble the clip on the first bracket.

6. The electronic device of claim 5, wherein the fastener comprises a head and a pole extending from the head, the mounting portion surrounds the pole and is rotatable relative to the pole.

7. The electronic device of claim 5, wherein the mounting portion is annular.

8. The electronic device of claim 1, wherein the guiding groove comprises a first section and a second section extending from the first section, and the first section angles with the second section.

9. The electronic device of claim 8, wherein the first section is horizontal and the second section is vertical and perpendicularly extends from an end of the first section.

10. The electronic device of claim 9, wherein the first section communicates with the second section.

11. The electronic device of claim 1, wherein a handle is formed on the electronic module.

12. The electronic device of claim 1, wherein a second bracket is mounted on the supporting plate, the second bracket faces and is spaced from the first bracket, and the first bracket, the second bracket, and the supporting plate cooperatively define a receiving chamber therebetween to receive the electronic module therein.

13. The electronic device of claim 12, wherein two elastic pressing portions protrude outwardly from opposite sides of the electronic module to abut the first bracket and the second bracket.

14. The electronic device of claim 13, wherein the two elastic pressing portions face each other.

15. An electronic device comprising: a frame comprising a supporting plate and a first bracket mounted on the supporting plate, and a mounting hole defined in the first bracket; an electronic module located at the supporting plate, and a guiding groove defined in the electronic module; a fastener; and a clip comprising a mounting portion and a clasp extending from the mounting portion, the fastener extending through the mounting portion, the mounting hole of the first bracket and engaging with the first bracket, wherein the clasp can slide along the guiding groove to elastically clasp the first bracket and wherein the clip further comprises a positioning portion, and a connecting arm, the first bracket comprises a positioning member, and the positioning portion elastically hooks the positioning member, the positioning portion and the mounting portion are respectively located at opposite ends of the connecting arm.

16. The electronic device of claim 15, wherein the guiding groove comprises a first section and a second section extending from the first section, and the first section angles with the second section.

17. The electronic device of claim 16, wherein a length of the second section is less than that of the first section.

* * * * *